United States Patent [19]

Gibson

[11] Patent Number: 5,694,401
[45] Date of Patent: Dec. 2, 1997

[54] FAULT ISOLATION USING PSEUDO-RANDOM SCAN

[75] Inventor: Walter E. Gibson, San Jose, Calif.

[73] Assignee: Tandem Computers Incorporated, Cupertino, Calif.

[21] Appl. No.: 787,452

[22] Filed: Jan. 22, 1997

Related U.S. Application Data

[63] Continuation of Ser. No. 266,913, Jun. 27, 1994, abandoned.

[51] Int. Cl.$^6$ ................................................. G01R 31/28
[52] U.S. Cl. ..................... 371/22.3; 371/22.5; 395/183.06
[58] Field of Search .................................. 371/22.3, 22.4, 371/22.5, 25.1; 324/500, 512; 395/181, 183.01, 183.06; 364/581, 717

[56] References Cited

U.S. PATENT DOCUMENTS

| | | | |
|---|---|---|---|
| 4,519,078 | 5/1985 | Komonytsky | 371/25 |
| 4,680,761 | 7/1987 | Burkness | 371/25 |
| 4,701,921 | 10/1987 | Powell et al. | 371/25 |
| 4,718,065 | 1/1988 | Boyle et al. | 371/25 |
| 4,817,093 | 3/1989 | Jacobs et al. | 371/25 |
| 4,947,357 | 8/1990 | Stewart et al. | 371/22.3 |

Primary Examiner—Hoa T. Nguyen
Assistant Examiner—Nadeem Iqbal
Attorney, Agent, or Firm—Townsend and Townsend and Crew

[57] ABSTRACT

A digital system, comprising a plurality of integrated circuits that are designed to be scannable for pseudo-random scan testing. Testing begins and proceeds in normal binary-tree fashion, subjecting the system to a pseudo-random scan test and developing from that test a signature that is compared to a standard signature. If the comparison is unequal, portions of the system are subjected to pseudo-random scan testing, in normal binary-tree fashion, until the integrated circuit level is reached whereat a final mis-compare for the signature developed for a integrated circuit is obtained. Then, each bit position of the scan for such integrated circuit is classified according to the source of data for its primary input, and pseudo-random scan testing conducted to extract signatures for each such classified source. When a bad signature is reached, after comparing to standard signatures, the fault has been isolated to the classified source.

6 Claims, 3 Drawing Sheets

FAULT ISOLATION USING PSEUDO-RANDOM SCAN

This is a Continuation of application Ser. No. 08/266,913, filed Jun. 27, 1994 now abandoned, the disclosure of which is incorporated by reference.

BACKGROUND OF THE INVENTION

The present invention is directed to testing digital systems, and more particularly to a digital system test that utilizes pseudo-random scan techniques to isolate a fault to a particular region or source.

The art of packaging electronic systems has seen numerous advances in recent years so that relative massive amounts of digital circuitry can be carried by extremely small packages and surface areas (e.g., integrated circuits, circuit boards, and the like). While the capability of providing electronic systems in diminutive packages may have a number of desirable advantages, they are not without certain problems. One such problem is that the ability to test such huge amounts of circuitry can be formidable. A number of techniques are available.

One test technique that has become increasingly popular of late determines only whether or not a digital system (or sub-system) is in working order, on a "GO-NO/GO" basis, using what is termed a pseudo-random scan test (PRST). According to this technique, the electronic circuits of the type capable of maintaining one of two digital states (e.g., flip-flops, latches, and the like; hereinafter, termed "scannable register"), or some of them, that are in the formation of the system are constructed so that they operate in one of two modes: a "normal" mode in which they operate to perform system-related functions for which they were selected, either alone or in various combinations (e.g., forming multi-bit registers, counters, and the like); and in a second (test) mode in which, responding to test signals, they form one or more long shift registers ("scan strings"). Typically, a PRST procedure involves placing a system under test in a scan test mode to form the scan strings. Deterministic and repeatable pseudo-random data is shifted ("scanned") into the scan strings so formed, in effect placing the system in a pseudo-random state. The system is then returned to the normal state and allowed to operate for (typically) one cycle of execution, after which it is returned to its scan test mode, again forming the scan strings, and the resultant data extracted by shifting it out of the system. This scan-in, execution, scan-out procedure, termed an "iteration," is performed preferably some power of 2 number of times (e.g., $2^{16}$ or 65,536) with the extracted results used to form a "test signature." The test signature is compared to a "Golden Signature," created by running the identical test on an identical system known to be in good operating condition, and if the compare is equal, the tested system is assumed to be in working order; if the compare is not equal, the system is assumed to be in a non-working condition. The number of iterations performed is typically a function of system design implementation parameters.

One modification of the PRST technique in use by the assignee of this invention provides the ability to isolate faults to a "scannable" bit (i.e., to determine which bit (or bits) of the scan string is (are) not correct). According to this modification, called the "raw bits" method, a digital system known to be in good working order is subjected to PRST to develop a number (e.g., "N") of Golden Signatures that are saved together with certain raw scan out data used to develop the Signature. Signature creation is as follows: For N=1, one iteration of PRST is run on the system and the resultant signature saved as the Golden Signature for N=1. The raw scan out data used to create the resultant signature is also saved. Then, two iterations of the PRST are run, developing the Golden Signature for N=2 that is saved along with the raw scan out data for the last (second) iteration; the third (N=3) Golden Signature is developed from three iterations and saved, again along with the raw scan out data from the last (third) iteration; and so on, until the Nth Golden Signature is developed from N iterations. Preferably, N is as large as possible, and is typically based on the size (number of bits) of the pattern generator used to generate the random pattern (e.g., a 16 bit generator would make N equal to $2^{16}$ or 65,536). Practically, however, N will most likely be limited by the space needed to save the signatures and raw data bits. A number found manageable for N is approximately 4096.

With the Golden Signatures and associated raw data so formed, a GO-NO/GO test and subsequent fault isolation proceeds as follows, using what is termed a binary search method. First the system under test (which would, of course, be configured identically to that used to develop the Golden Signatures) is subjected a PRST a system test of N/2 iterations to develop an N/2 test signature that is compared to the corresponding Golden Signature. If the compare is equal, a PRST of 3N/4 iterations is run to develop a 3N/4 test signature that is compared to the 3N/4 Golden Signature. If this compare is also good, the distance between that test (number of iterations) and the top (number of iterations) is split and a PRST again run, and the resultant signature compared to the corresponding Golden Signature. Those skilled in this art will recognize this as a binary search routine that continues until an end is reached with no mis-compare found between the test signatures and the corresponding Golden Signatures at iteration N, resulting in the conclusion that the system is in operative order. If, however, a mis-compare is found then, rather than proceeding upward, the next test signature is developed from performing a PRST that is one-half the number of iterations between the last PRST and the immediately preceding PRST. For example, if a mis-compare results from the signature comparisons of the PRST for 3N/4, the next PRST will have 5N/8 iterations.

Using this PRST binary search routine a point will ultimately be reached when the number of iterations for two PRSTs resulting in a compare and a mis-compare are one apart, i.e., $N_m$ iterations produces a good compare, but $N_{m+1}$ iterations produces a bad compare. The raw data bits are analyzed to determine the scannable bits, and their locations (e.g., the integrated circuit) detecting the mis-compare. At this point the raw data bits associated with the $N_{m+1}$ Golden Signature is passed to a "guided-probe" traceback procedure, involving the assistance of a person. Then, the failing circuit can be manually examined to determine if any inputs to that circuit come from off the chip (integrated circuit). If so, a guided-probe traceback procedure can be used to locate the fault to a replaceable (or repairable) component or a defective circuit interconnection, etc. Alternatively, there are semi-automatic guided-probe traceback techniques that may be employed in which manual placement of a probe is made according to instructions displayed be a tester unit.

However, such testing, in addition to being arduous, is extravagant in both time and storage space needed to for saving the Golden Signatures and the associated raw scan out data; it can also be labor intensive insofar as human intervention is required for placement of probes to perform the guided-probe traceback. Further, these techniques do not automatically and readily identify a failed integrated circuit or failed circuit board within a digital system. Further still, as circuit densities have increased (and with them the densities achieved on circuit boards), the length of time to collect the Golden Signatures and associated raw scan out data, and amount of storage needed to perform such testing has become exorbitant.

Accordingly, if this type of pseudo-random testing is to be used, a different fault analysis approach is needed.

SUMMARY OF THE INVENTION

The present invention provides a method, and apparatus for implementing that method, to obtain fault isolation down to a source (e.g., integrated circuit, circuit board, and the like) of a fault, using much less data and, therefore, less time and storage space. In addition, the invention provides a fault analysis procedure that can isolate a fault to a domain of the system under test without requiring human intervention.

Broadly, the method of the invention performs pseudo-random scan tests (PRST) on a system of the type incorporating one or more scannable integrated circuit chips, obtaining therefrom a test signature that is compared to a golden or standard signature. If the comparison results in a match, the system is considered good. If, on the other hand, the comparison results in a mis-match, a binary search routine is performed, running separate PRSTs on the digital system and selecting portions of the scan out data to develop sub-signatures that are compared to Golden Sub-Signatures until the search is narrowed to an integrated circuit producing a faulty sub-signature. A PRST is performed on the system, but looking only at those bits scanned out of the integrated circuit chip detecting the fault, this time selecting predetermined portions of the scanned bits according to the primary source, or sources, that produce that bit; that is, each scannable bit of a scan string is classified according to the source of the signal (or signals) applied to the input of the corresponding scannable register. (The signal source is sometimes referred in this art as "primary inputs," and the scannable register is sometimes referred to as the "primary output.") The test control signals (i.e., SCAN, HOLD, etc.; identified and described hereinafter) are excluded from this classification. The test signature developed from each of the selected bits of the same classification are compared to similarly produced Golden Signatures, until a mis-match is found, identifying and isolating the fault according to the classification of the scannable bits found to be faulty (e.g., chip, board, within the system, or containing source inputs external to the system).

In the preferred embodiment of the invention, apparatus is provided that includes a test processor for producing the test signals, including the deterministic and repeatable pseudo-random data, that are applied to the integrated circuit chips of the system to perform a PRST. The system is formed to have test data paths from each scan output of each integrated circuits chip to a multiplexer forming a part of the test processor to selectively apply the extracted test data to a multiple-input linear feedback shift register (MISR) that develops the signature. During the PRSTs, selected scan data outputs of the integrated circuit chips are applied to the MISR, while others are blocked from being inputs to the MISR.

Using the method and apparatus of the present invention, a minimum number of signatures need be obtained for isolating a fault to a particular fault area. The large amounts of raw data needed in prior art techniques of fault isolation, and the concomitant time necessary to perform the isolation techniques, are no longer needed with the present invention to isolate to a defective scannable integrated circuit or board.

These and other features and advantages of the present invention will become apparent to those skilled in the art upon a reading of the following detailed description of the invention, which should be taken in conjunction with the accompanying drawings.

DESCRIPTION OF THE PREFERRED EMBODIMENT

Figure 1:
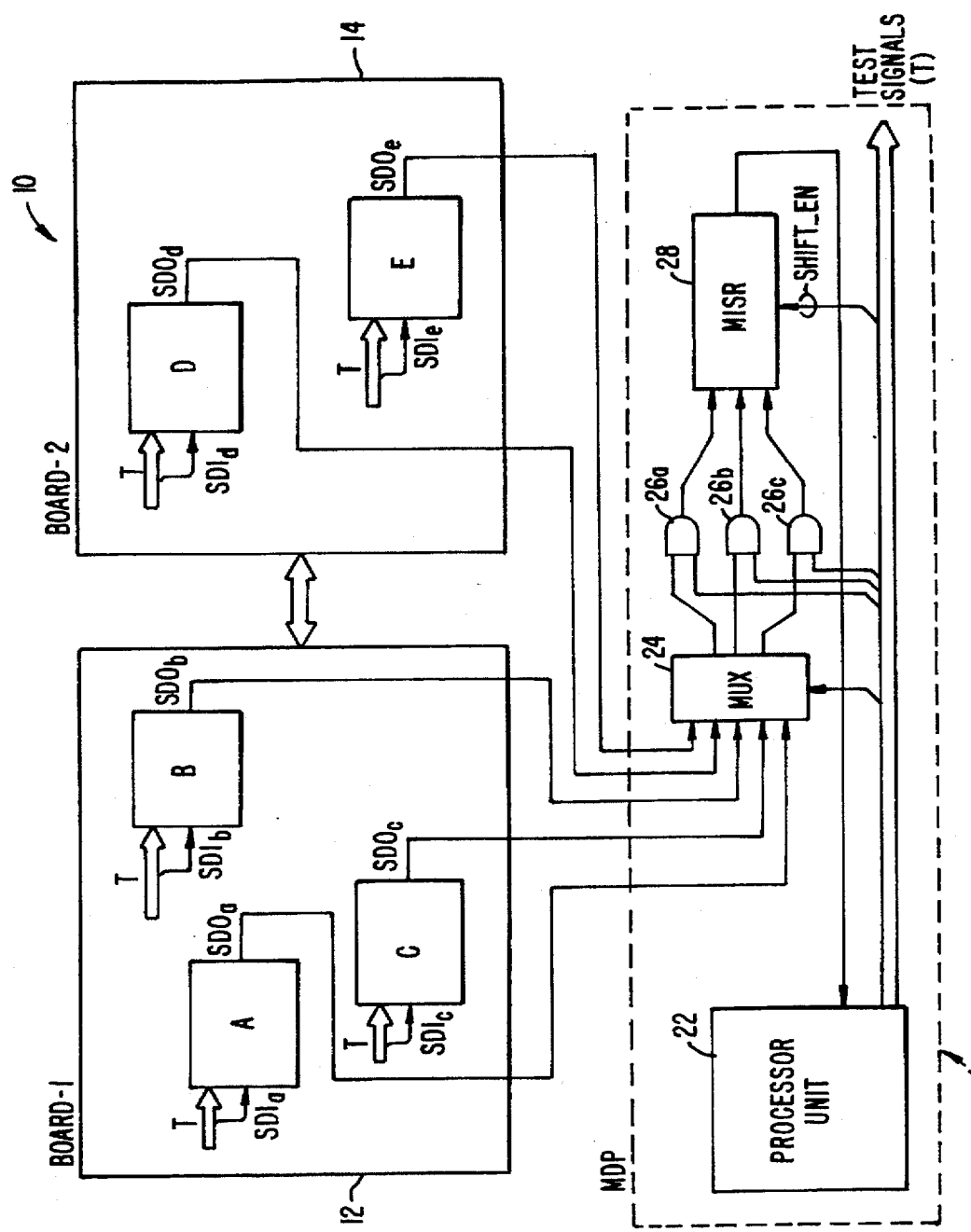
FIG. 1 is a simplified block diagram representation of a digital system together with a maintenance diagnostic processor constructed to implement the method of the present invention.

FIG. 1 shows a simplified block diagram of a digital system, designated generally with reference numeral 10, constructed in accordance with the teachings of the present invention. It will be obvious to those skilled in the art that, in actual practice, this system may comprise larger amounts of digital circuitry, and in fact the system with which the present invention is used does utilize larger numbers of circuit components and boards. FIG. 1 is a simplified diagram for the purposes of illustrating and explaining the present invention.

FIG. 1 illustrates the digital system 10 as including a pair of integrated circuit boards 12 and 14. Circuit board 12 carries integrated circuits A, B, and C, while circuit board 14 carries integrated circuit chips D and E. It will be understood that the integrated circuits A, B, . . . , E are constructed to be subjected to PRST type testing in that they will incorporate in their design scannable registers of the type described above capable of forming the shift registers for PRST. Preferably, the scannable registers will form only one shift register or scan chain for each integrated circuit A, B, . . . , E.

Accompanying the system 10 is a maintenance diagnostic processor (MDP) 20 whose main components include a processor unit 22, a multiplexer 24, gating circuitry in the form of two-input AND gates 26, and a multiple-input linear feedback shift register (MISR) 28. The processor unit 22 operates to develop and produce test signals (T) that are coupled and applied to each of the integrated circuits A, B, . . . , E by individual scan data paths. For PRST, the processor unit 22 will assert the necessary test signals that cause the scannable registers of the integrated circuits A, B, . . . , E to form the PRST shift registers or "scan chains." The MDP 20 includes a pattern generator (Preferably, a multiple output linear feedback shift register (MOSR), not shown) to produce serial streams of pseudo-random data that are coupled to the scan data (SDI) inputs of each of the integrated circuit chips A, B, . . . , E. Serial data extracted from the integrated circuits A, B, . . . , E from scan data outputs (SDO) are communicated by serial data lines to the multiplexer 24 of the MDP 20. The processor unit 22 controls the multiplexer 24 and the AND gates 26 to select and apply the "scan line" extracted from each integrated circuit A, B, . . . , E to the MISR 28, producing a signature.

The multiplexer 24 is a 2-to-1 multiplexer in which each of the two inputs, and the output, is three bits wide. Thus, for each PRST iteration, and in response to a selection signal from the processor 22, the multiplexer selects and couples, in parallel, the SDO outputs from the integrated circuits A, B, and C to the MISR 28 via the AND gates 26 (while holding the integrated circuits D and E in a frozen state in a manner described below), and then switching the multiplexer selection to D and E (the third of the three inputs in the second half of the multiplexer 28 is not used).

As will be seen, according to the present invention, there will be the need to be able to select portions or bits of selected ones of the scan strings from the integrated circuits A, B, . . . , E. This feature of the invention is performed by the AND gates 26. For example, assume that only certain of the scannable bits obtained from the integrated circuit B is to be used to develop a test signature. The system 10 is subjected to a PRST, under control of the processor 20, and the scan out data from the integrated circuits B, D, and E selected for application to the AND gates 26. The processor 20, by selectively enabling the AND gate 26 corresponding to the integrated circuit A (e.g., AND gate 26a), couples the scan out data from the integrated circuit A to the MISR 28 while withholding application of the scan out data from the integrated circuits B and C by disabling the corresponding AND gates 26 (e.g., AND gates 26b and 26c). In similar fashion, rather than using the entire scan out data from the integrated circuit A, the processor may select portions by selectively enabling and disabling the shifting of MISR 28 by controlling the shift enable ($S_{13}EN$) test signal.

Preferably, the MISR will be of a different size than the pattern generator (MOSR; not shown) used to generate the test pattern for PRST. Thus, for example, the pattern generator may a 17-stage shift register, while the MISR preferably includes a 20-stage shift register.

Figure 2:
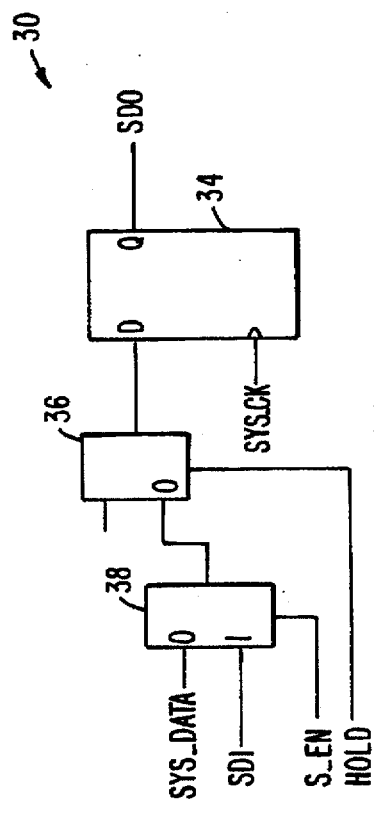
FIG. 2 is a block diagram of a representative scannable register that may be used in connection with the method and apparatus of the present invention.

Illustrative of the type of scannable register preferably used in connection with the present invention is that shown in FIG. 2 and designated generally with the reference numeral 30. It will be evident to those skilled in the art that other configurations of a scannable bit, such as that shown in FIG. 2, can be designed, and the illustration of the scannable register 30 is used herein as an aid in explaining the present invention.

As FIG. 2 shows, the scannable register 30 includes a D-type flip-flop 34 having a clock input (indicated by the right pointing triangle) that receives the system clock ($SYS_{13}CK$) signal used by the particular integrated circuit A, B, . . . , E containing the scannable register 30. The data (D) input of the flip-flop 34 receives the output of a two-input multiplexer 36, one input of which receives the output of a second two-input multiplexer 38. The second input of the multiplexer 36 receives the data (Q) output of the flip-flop 34, which also forms the scan data output (SDO) for the scannable register 30.

System data (SYS_DATA), i.e, that data applied to the scannable register 30 when being used in its normal mode, is received at one input of the multiplexer 38, while scan data (SDI) is received at the second input. Selection between SYS_DATA and SDI is made when a scan enable (S_EN) test signal is asserted (by the processor unit 22). Selection between the output of the multiplexer 38 and the data (Q) output of the flip-flop 34, by the multiplexer 36, is affected by the HOLD test signal. When HOLD is asserted, the scannable register 30 is placed in a state that causes it to maintain its one-bit content until the HOLD test signal is dropped.

The scan methodology used by the present invention does not control the clock signal to the scannable registers of the integrated circuits A, B, . . . , E; rather, the clock signal (SYS_CK) is left to free-run, and the scannable registers are controlled—by synchronous application of the SCAN and HOLD signals to respectively shift data or hold (freeze) their content, in addition to using these test signals to switch between the normal and test (serial scan) modes.

Normal operation has the scannable register 30 operating to receive, with each pulse of the SYS_CK signal, system data (SYS_DATA). When, however, the S_EN test signal is asserted by the processor unit 22, the integrated circuits A, B, . . . , E are placed in a serial scan mode. The data inputs (D) of the flip-flop 34 of the scannable registers 30 of each integrated circuit A, B, . . . , E will receive either an SDO output of another scannable register 30, or the SDI input of the integrated circuit. Scan data from the processor unit 22 may be shifted into and through each of the scannable registers 30 with each pulse of SYS_CK. At any time the HOLD test signal can be asserted to (while the S_EN remains asserted) to have the scan chains hold their content until the HOLD test signal is dropped.

Digressing for the moment, when in a test mode, the shift-in, execute, and shift-out PRST iterations described above are employed to produce various test signatures that can be compared to Golden Signatures for the system 10 of FIG. 1. The individual bit positions of the shift-out portion of any iteration can, however, be classified for each integrated circuit A, B, . . . , E according to the source(s) that produced the state of that scannable bits during the execute portion of the iteration. This may be better understood with reference to FIG. 3, which shows representative scannable registers 80, 82, 84, and 88 carried by integrated circuit E' (on circuit board 14'), scannable registers 90 and 94 carried by integrated circuit D' and scannable register 96 of integrated circuit B' (on circuit board 12'). Certain combinatorial logic (e.g., 81, 85, etc.) may connect the outputs of scannable registers, or input pins, to the inputs of other scannable registers, as discussed further below.

Figure 3:
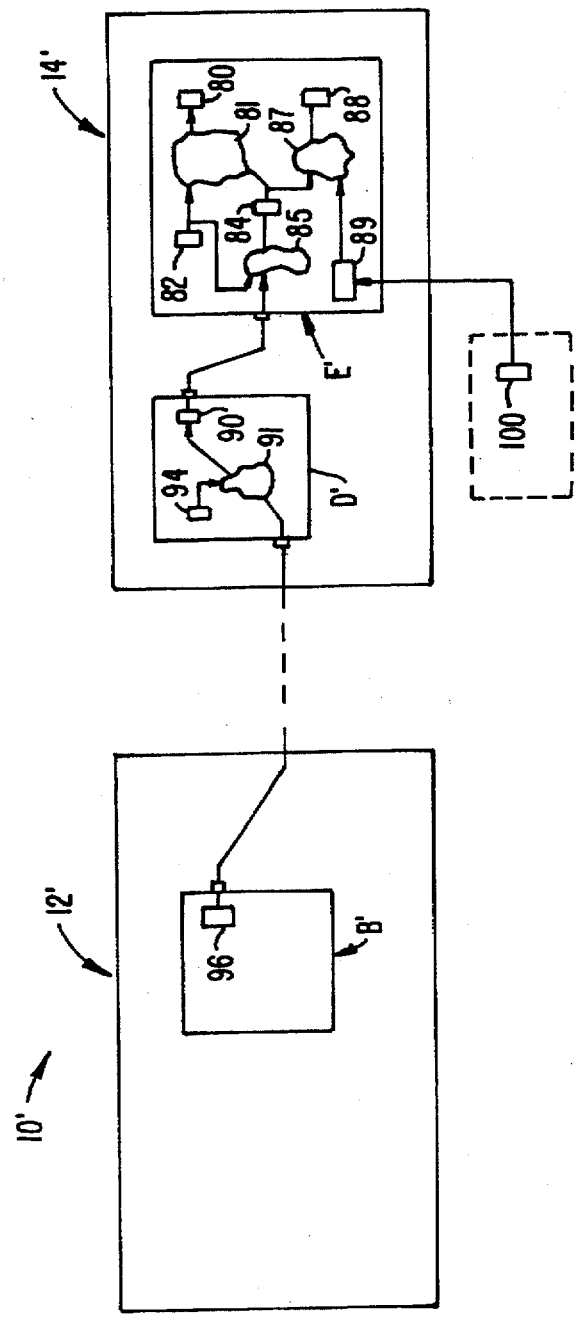
FIG. 3 is a diagram to illustrate the preferred "classification" of scannable bits produced by an integrated circuit chip of FIG. 1 according to the source that may produce that scannable bit.

The scannable register 80 is shown in FIG. 3 as receiving at its data input the outputs of two other scannable registers, 82, 84 also formed on the integrated circuit chip E', through combinatorial logic 81. Since no source for the data input to the scannable register 80 is from somewhere other than the integrated circuit chip E', the scannable bit produced by the register 80 is classified as a "chip" (C) type.

Continuing, FIG. 3 illustrates the source of the scannable register 84 as being developed by the output of the register 82 (carried by the integrated circuit E'), and by the output of a scannable register 90 formed on the integrated circuit chip D', via combinatorial logic 85. Since at least one source for the development of the scannable bit produced by the scannable register 84 is external to the integrated circuit chip E', but on the same circuit board (here, 14') as the integrated chip E', the scannable bit is classified as "board" (B) type.

The scannable register 90 of integrated circuit D' is, on the other hand, developed from a scannable register 94, of the integrated circuit chip D', and from (via combinatorial logic 91) the output of the scannable register 96 of integrated circuit B' of circuit board 12'. Since the scannable bit developed by the scannable register 90 is influenced by a source not solely on the integrated circuit D' or circuit board 14', but still within the system 10', the scannable bit produced by the scannable register 90 is classified as "system" (S) type.

Finally, returning to the integrated circuit chip E' on the circuit board 14', FIG. 3 shows the register 88 as receiving, through combinatorial logic 87, the output of a source 100 (via fence logic 89) that is not located within the system 10', but is, rather, external to the system 10. Accordingly, the scannable bit developed by the scannable register 88 is classified as an "external" (X) type. Typically, the source 100 will be "fenced" form influencing the system 10 during a PRST because a test signal (developed by the processor 20) applied to the fence logic 89 to inhibit the source 100 from being communicated to the combinatorial logic 87 and, therefore, to the scannable register 88. However, the possibility of the fence logic 89 being defective is included as the external (X) bit.

Figure 4:
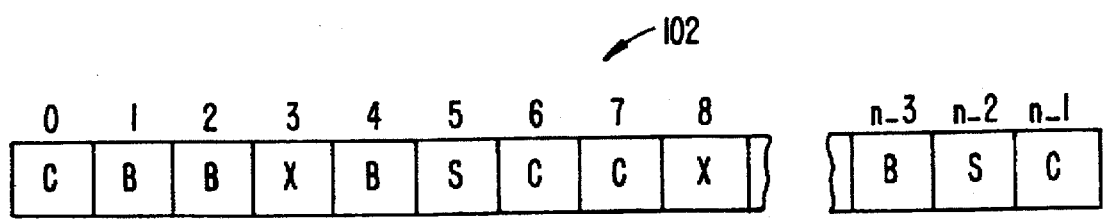
FIG. 4 is a representation of a data string obtained from an integrated circuit chip of FIG. 1, illustrating the classification of each scannable bit.

With these four classifications, chip (C), board (B), system (S), and external (X), any scan chain extracted from an integrated circuit chip at the conclusion of one PRST iteration can have each of its scannable bits so identified in accordance with the source producing that scannable bit. This classification of the scannable bits of a scan chain is illustrated in FIG. 4. As FIG. 4 shows, an N-bit scan chain 102 includes N scannable bit positions 0, 1, ..., N–2, N–1. Bit positions 0, 6, 7, ..., and n–1 are chip (C) type, i.e., produced by scannable registers, such as register 80 (FIG. 3), whose inputs are developed solely from sources located on the same integrated circuit chip. Scannable bit positions 1, 2, 4, ..., and N–3 are developed by registers whose input receives at least one source not on the integrated circuit chip, but still contained within the particular board that carries the integrated circuit producing the scan chain 102 such as, for example, register 84 (FIG. 4) of integrated circuit E', circuit board 14'. Similarly, scannable bit positions 5, ..., and N–2 are type S, indicating that they are developed by scannable registers whose inputs receive data from a source not on the same circuit board, but within the same system 10. Finally, bit positions 3 and 8 (and perhaps others) receive data developed from at least one source that is not within the system 10.

Figure 5:
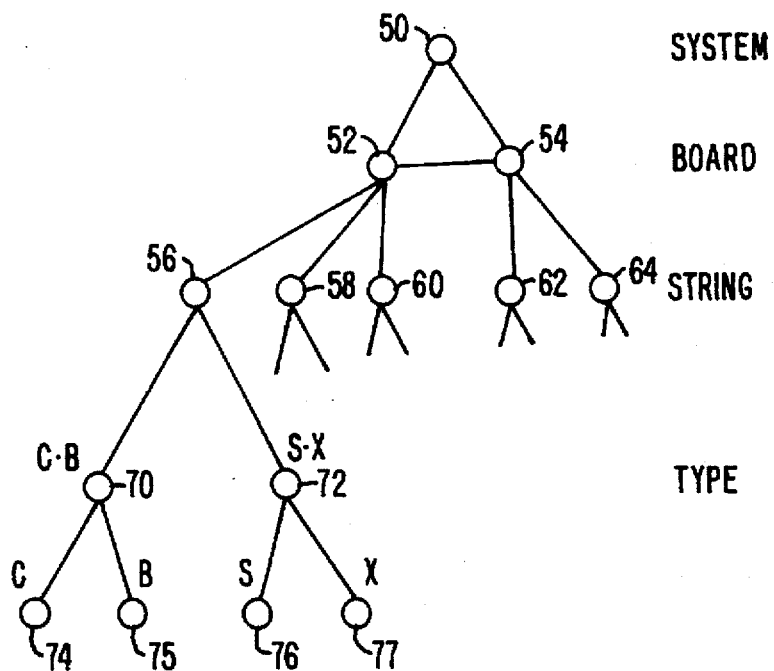
FIG. 5 is a tree diagram that illustrates the binary tree search procedure used in connection with the present invention.

Golden Signatures for the system 10 (FIG. 1) are developed, and used, substantially in the same manner as described above for conventional PRST testing—up until a mis-compare for an integrated circuit is found. Referring to FIG. 5, which is a tree diagram that illustrates the binary search paths used in the present invention. The search, at various steps (eg., 50, 52, 54, etc.) will subject the system to PRST to obtain a test signature that is compared to a Golden Signature. Golden Signatures are created as follows. At step 50, a known operable version of the system 10 is placed in a test mode by the MDP 20, and pseudo-random scan data applied to the SDI inputs of the integrated circuits A, B, .. ., E in parallel. The MDP 20 then switches the system to the normal mode for one cycle of SYS_CK, and returns it to test mode. The HOLD test signal is asserted for two of the integrated circuits, e.g., those of board 14 (integrated circuits D and E) to freeze their state while the other three integrated circuits, e.g., those of board 12 (integrated circuits A, B, and C) are coupled to the MISR 28 via the multiplexer 28 (and AND gates 26) and the scan state of those integrated circuits extracted and applied to the MISR 28. Next, the integrated circuits A, B, and C are placed in a hold state, and the other two integrated circuits D and E selected, their state extracted and applied in parallel to the MISR 28. This completes one iteration of the PRST. Approximately $2^{17}$ (dictated by the size of the MOSR—not shown) more such PRST iterations are performed in this manner, resulting in the development of a signature. Since this signature was developed from a system 10 known to be good, this is the Golden Signature at the system level for the system 10.

Now, Golden Signatures for each circuit board are created. Thus, for example, at step 52 the Golden signature for the circuit board 12 is developed by performing the same $2^{17}$ (131,072) iterations described above, except that only the integrated circuits A, B, and C are applied to the MISR 28. Similarly, at step 54 the Golden Signature for the circuit board 14 is created, applying the scan out data extracted from only the integrated circuits D and E.

At the "String" level of the flow diagram of FIG. 5 the Golden Signatures for the individual integrated circuits A, B, ..., E are developed in the same manner at steps 56, 58, . ..., 64, respectively. This will require selectively enabling and disabling the AND gates 26 in order to coupled the scan chain from only the desired integrated circuit to the MISR 28. From there, however, things differ from what has been done before. At steps 70, 72 (and similar pairs of steps depending from the String level steps of 58, ..., 64—not shown for reasons of clarity) a first Golden Signature is created for the integrated circuit A, by performing PRST iterations and selecting only the chip (C) and board (B) type scannable bits for application to the MISR 28. Only one output from the multiplexer is coupled to the MISR 28. The MISR 28 itself receives test control signals instructing it when to accept scan out data and when not to accept data for creating the resultant signature. Thus, as the scan out data is applied to the MISR 28 that data will be accepted or rejected according to the control signals from the processor 20. The processor 20 will be provided information as to which bit positions of the scan strings developed from the integrated circuits have what classifications, and can manipulate operation of the MISR 28 accordingly, as described. Thus, with reference to FIG. 4, to collect the signature for scannable bits of type chip (C) and board (B), and assuming that the front of the scan chain 102 to be bit 0, the processor 20 would know to command the MISR 28 to shift in (i.e., "signature") bits 0, 1, 2, and skip (no shift) bit 3, shift in bit 4, skip bit 5, and so on. Again, $2^{17}-1$ more of these iterations, with the shift, skip, etc. steps each iteration, are performed to develop the Golden Signature for the integrated circuit corresponding to step 70. In like fashion step 72 creates a Golden Signature, using only the system (S) and external (X) type scannable bits.

At the next level, four more Golden Signatures are created at steps 74, 75, 76, 77 in which, for each step, only chip (C),board (B), system (S), and external (X) type scannable bits, respectively, are used. The remaining String level steps 58, 60, ..., 64 will have similar trees containing steps whereat combined chip/board and system/external type Golden Signatures are produced, and separate chip, board, system, and external Golden Signatures are produced.

Golden Signatures are collected by first performing a PRST at the system level, and then moving down to the next level, and horizontally across (to the right in FIG. 5) the steps in that level. Thus, collection would proceed as follows: step 50, steps 52 and 54, steps 56, 58, 60, 62, and 64, and so on. It is believed, however, that other collecting methods would be just as effective.

With the Golden Signatures in hand, other units of the system 10 can be tested, using basically the same procedure as used to develop the Golden Signatures. A test according to the present invention proceeds as follows. Referring again to FIG. 5, which is now, for test purposes, a tree diagram that illustrates the paths to be followed to fault isolation, step 50 creates a PRST test signature for the system 10 that is compared to the Golden Signature for the system. The development of the test signature is in the same manner as described above for creating the Golden Signature. The test signature so obtained is compared to corresponding Golden Signature for the system, and if they match, the system tested is assumed to be in proper operating condition. If, on the other hand, the test and Golden signatures do not match, the system is assumed to be faulty, and the process proceeds to locate the fault down to a board or integrated circuit chip or the system level. In all subsequent steps the identical PRST stimulus is still applied to the system 10 as was used in step 50.

Thus, if the step 50 provides an indication of a fault, the method proceeds first to step 52, and develops a test signature for the associated board (e.g., board 12). If the comparison of the board test signature to the corresponding Golden Signature matches, the remaining board (e.g., board 14) is similarly tested at step 54. If, however, the signatures do not match, the test moves to the string level for the board found to produce a faulty signature. Assume that step 52 is a test of the circuit board 12, and that the test signature did not match the Golden Signature for that board. The method moves to the String level (steps 56, 58, and 60 for a failure at step 52) and at step 56 creates a test signature for the integrated circuit A. If the test signature for the integrated circuit A matches the corresponding Golden Signature, step 58 is executed to create a test signature for the integrated circuit B. If comparison indicates that integrated circuit B is not producing a faulty signature, step 60 is executed for integrated circuit C. If the signature produced at step 60 is not faulty, the test procedure will move back up the tree one leaf (here, to step or leaf 52), and to the right one leaf (to step 54) and resume testing. If all steps at a level fail to produce a faulty signature, the procedure again moves back up the tree one leaf, and to the right one leaf to resume testing, until the system level (step 50) is reached, at which time the procedure gives up, signalling that it is unable to localize the fault, raising the suspicion that the test hardware is faulty.

Although not specifically shown in FIG. 5 for reasons of clarity, the leafs (steps) 58, 60, 62, and 64 have leaves at levels below them similar to the leaves below leaf (step) 56.

Assume that step 56 found that the test signature of integrated circuit A (FIG. 1) did not match its corresponding Golden Signature, it is known now that the fault is either on the integrated circuit A or is developed by a source that is input to the integrated circuit chip A. Accordingly, the digital system 10 is again subjected to a PRST, at step 70, except that now only those bit positions classified as chip (C) and board (B) are selectively gated from only integrated circuit A, by the multiplexer 24 and AND gates 26 (FIG. 1), to the MISR 28 to develop the test signature. Assuming that the test signature so developed matches its corresponding Golden Signature, the procedure proceeds to step 72, again developing a test signature, but this time using only those bits classified as system (S) and external (X) to develop the test signature. A mis-match with the corresponding Golden Signature should now be obtained, or else the test hardware should be suspected.

Assume, however, that step 70 obtained a test signature that did not match the corresponding Golden Signature. It is now known that either a chip or a board type bit caused the fault. Accordingly, another test signature is developed, using only the chip (C) type scannable bits. If the test signature matches the corresponding Golden Signature, it is now known that the fault is on the board 12, and at step 76 a scan test procedure is run using only the board (B) type bits to develop the test signature, which should confirm that the board is faulty.

In this manner, faults can be either isolated to a particular integrated circuit chip, or a board, the system (e.g., interconnect between the two boards), or it is external to the system, or contained in the path from an external system (e.g. source 100; FIG. 3) to a scannable bit of type "X."

The Golden Signatures developed for the chip/board/system/external test procedures are done so in the same manner as the test. That is, for example, using a system 10 known to be in proper operating condition, each integrated circuit chip is scan tested to produce Golden Signatures using only chip and board type bits, system/external bits, chip bits only, board bits only, system bits only, and finally only external type bits.

What is claimed is:

1. A method of fault isolation by pseudo-random scan-testing a digital system having a number of integrated circuits, each of the integrated circuits including a plurality of logic elements each operating in a first mode as a one-bit storage element having an input receiving data from a corresponding source and, in response to test signals, in a second mode to form one or more scan shift registers, each of the scan shift registers having a scan data input and a scan data output permitting pseudo-random testing to be performed, the method comprising the steps of:

classifying each of the one-bit storage elements of each of the number of integrated circuits according to the corresponding source applying data to the input of such one-bit storage element when operating in the first mode;

asserting the test signals;

applying pseudo-random scan data to the scan data input of each of the number of integrated circuits;

sequentially selecting data from the scan data output of each of the number of integrated circuits to obtain output scan data for comparison to a predetermined output scan data indicative of operability;

if the output scan data from one of the number of integrated circuits does not compare to the predetermined output scan data, applying again pseudo-random scan data to obtain scan data from one of the number of integrated circuits and selectively extracting portions of the scan data according to classification; and comparing the extracted portions to selected portions of the predetermined scan data to isolate a fault according to said classification.

2. The method of claim 1, wherein each pseudo-random test includes the steps of asserting test signals to the one-bit storage elements for forming the one or more scan shift registers and applying pseudo-random data to scan data input of each one or more scan shift registers, and obtaining data from the scan data outputs of the one or more shift registers.

3. A method for isolating faults in a digital system formed from at least two circuit groups each including a plurality of logic elements operating in a first mode as a one-bit storage element having a data source input and, in response to one or more test signals, in a second mode to form one or more scan shift registers, each of the scan shift registers having a scan data input and a scan data output permitting pseudo-random testing to be performed to obtain from the scan data output scan data, the method comprising the steps of:

classifying each bit position of the scan data according to data received by the logic element corresponding to said bit position;

providing a plurality of Golden Signatures, including a system Golden Signature indicative of proper operation of the digital system, a first group Golden Signature indicative of proper operation of a one of the two circuit groups, and a second Golden Signature indicative of proper operation of the other one of the two circuit groups;

subjecting the digital system to a pseudo-random test to obtain a system signature developed from scan data extracted from the scan shift registers;

comparing the system signature to the system Golden Signature and terminating the testing if the system signature and system Golden signature match;

subjecting the digital system again to the pseudo-random test and extracting first predetermined bit positions from the scan data corresponding to predetermined ones of the logic elements according to a first classification to obtain a first group signature from the scan data corresponding to the one of the two circuit groups, and terminating the test if the first group signature and the first Golden Signature do not match with an indication of the fault being isolated on the one circuit group; and subjecting the digital system yet again to the pseudo-random test and extracting second predetermined bit positions from the scan data corresponding to predetermined ones of the logic elements according to a second classification to obtain a second group signature from the scan data corresponding to the other of the two circuit groups to provide an indication of the fault being isolated in the other of the two circuit groups if the second group signature does not match the second Golden Signature.

4. The method of claim 1, wherein the classifying step includes classifying each of the one-bit storage elements of each of the number of integrated circuits according to whether the corresponding source applying data to the input of such one-bit storage element when operating in the first mode is located on the integrated circuit carrying such one-bit storage element.

5. The method of claim 4, wherein the classifying step includes classifying each of the one-bit storage elements of each of the number of integrated circuits according to whether the corresponding source applying data to the input of such one-bit storage element when operating in the first mode is not located on the integrated circuit carrying such one-bit storage element.

6. The method of claim 3, wherein the classifying step includes classifying each bit position of the scan data according to which of the two circuit groups provides the data received by the logic element corresponding to said bit position.

* * * * *